United States Patent
Tanaka et al.

(10) Patent No.: US 7,978,488 B2
(45) Date of Patent: Jul. 12, 2011

(54) THREE-LEVEL POWER CONVERTING APPARATUS

(75) Inventors: Takeshi Tanaka, Tokyo (JP); Ryousuke Nakagawa, Tokyo (JP)

(73) Assignee: Mitsubishi Electric Corporation, Chiyoda-Ku, Tokyo (JP)

( * ) Notice: Subject to any disclaimer, the term of this patent is extended or adjusted under 35 U.S.C. 154(b) by 709 days.

(21) Appl. No.: 11/663,437

(22) PCT Filed: Apr. 7, 2006

(86) PCT No.: PCT/JP2006/307483
§ 371 (c)(1), (2), (4) Date: Mar. 21, 2007

(87) PCT Pub. No.: WO2006/129421
PCT Pub. Date: Dec. 7, 2006

(65) Prior Publication Data
US 2009/0207639 A1 Aug. 20, 2009

(30) Foreign Application Priority Data
Jun. 1, 2005 (JP) ................................. 2005-161661

(51) Int. Cl.
*H05K 5/02* (2006.01)
*H05K 5/06* (2006.01)
(52) U.S. Cl. .................... 363/141; 363/125; 361/688
(58) Field of Classification Search ............. 361/688, 361/689, 699, 702, 703, 709, 710; 363/125, 363/126, 128, 141
See application file for complete search history.

(56) References Cited

U.S. PATENT DOCUMENTS

| | | | |
|---|---|---|---|
| 5,801,936 A | 9/1998 | Mori et al. | |
| 6,272,028 B1 * | 8/2001 | Satoh et al. | 363/56.05 |
| 6,768,193 B2 * | 7/2004 | Nakamura et al. | 257/707 |
| 2003/0090873 A1 * | 5/2003 | Ohkouchi | 361/704 |
| 2005/0111246 A1 | 5/2005 | Lai et al. | |

FOREIGN PATENT DOCUMENTS

| JP | 10-42573 A | 2/1998 |
|---|---|---|
| JP | 11-89249 A | 3/1999 |
| JP | 2003-79162 A | 3/2003 |

OTHER PUBLICATIONS

Extended European Search Report dated Nov. 29, 2010 in European Application No. 06731430.
PCT/ISA/210 and PCT/ISA/237.

* cited by examiner

*Primary Examiner* — Gary L Laxton
*Assistant Examiner* — Nusrat J Quddus
(74) *Attorney, Agent, or Firm* — Buchanan Ingersoll & Rooney PC

(57) ABSTRACT

Each phase of a three-level power converting apparatus is configured by a single unit, and four switching devices (1u-4u) and two diodes (9u, 10u) provided in each unit are arranged along a flow direction of cooling air on a heat sink (15) of a cooling device with long sides of the switching devices (1u-4u) and the diodes (9u, 10u) oriented perpendicular to the flow direction of the cooling air. The first and second diodes (9u, 10u) are arranged in a central area of the heat sink (15), whereas the second switching device (2u) and the third switching device (3u) with high heat generation loss are arranged in a distributed fashion to sandwich a group of diodes in the central area in between.

6 Claims, 7 Drawing Sheets

US 7,978,488 B2

THREE-LEVEL POWER CONVERTING APPARATUS

TECHNICAL FIELD

The present invention relates to a three-level power converting apparatus including a plurality of semiconductor devices and a cooling device, for instance.

BACKGROUND ART

In a conventional three-level power converting apparatus, semiconductor devices, such as switching devices and diodes, constituting a main circuit of each phase configure a single unit, in which the main circuit is configured such that four semiconductor devices including first to fourth semiconductor devices are connected in series between a positive direct current (DC) terminal and a negative DC terminal, a first diode and a second diode are connected in series, an alternating current (AC) terminal is connected to a joint between the second semiconductor device and the third semiconductor device, a neutral point terminal is connected to a joint between the first diode and the second diode, the first diode is connected to a joint between the first semiconductor device and the second semiconductor device, and the second diode is connected to a joint between the third semiconductor device and the fourth semiconductor device. A group of semiconductor devices constituting one unit are arranged on a heat sink portion of a cooling device with short sides of the individual semiconductor devices facing a direction from which cooling air flows, in which the first diode and the second diode with low heat generation loss are disposed in a central area of the heat sink portion of the cooling device, the second semiconductor device and the third semiconductor device with high heat generation loss are disposed on both sides of the first and second diodes, and the first semiconductor device and the fourth semiconductor device whose heat generation loss is lower than that of the second and third semiconductor devices are disposed at both ends of the heat sink portion (refer to Patent Document 1, for example).

Patent Document 1: Japanese Patent Application Publication No. 2003-79162

DISCLOSURE OF THE INVENTION

Problems to be Solved by the Invention

In the conventional three-level power converting apparatus, groups of semiconductor devices of a plurality of units are arranged adjacent to one another on upstream and downstream sides of a flow of the cooling air, so that the semiconductor devices in the plurality of units are also arranged adjacent to one another on the upstream and downstream sides of the flow of the cooling air. The semiconductor devices of a unit on a downwind side are affected by the influence of exhaust heat from the semiconductor devices of a unit on an upwind side in addition to heat generation by the semiconductor devices of the downwind unit itself. For this reason, there has been a problem that it is difficult to keep temperature increase within a permissible range in an area in which the devices with high heat generation loss of the plurality of units are arranged to face the direction from which the cooling air flows because the semiconductor devices of the downwind unit are not adequately cooled.

This invention has been made to resolve the problem mentioned above. Accordingly, it is an object of the invention to obtain a three-level power converting apparatus capable of achieving increased cooling efficiency of a cooling device by reducing the influence of exhaust heat from semiconductor devices disposed on the upwind side of the cooling device on semiconductor devices which are disposed on the downwind side of the cooling device and thus averaging temperature increases of the individual semiconductor devices.

Means for Solving the Problems

In a first three-level power converting apparatus according to the present invention, each of phases constituting a power converting portion is configured by a single unit. Each unit includes four switching devices including first to fourth switching devices which are connected in series in this order between a positive terminal and a negative terminal of DC side, a first diode connected between a joint between the aforesaid first switching device and the aforesaid second switching device and a DC side middle terminal, a second diode connected between a joint between the aforesaid third switching device and the aforesaid fourth switching device and the aforesaid middle terminal, and an AC terminal between the aforesaid second switching device and the aforesaid third switching device. The aforesaid plurality of switching devices and the aforesaid plurality of diodes constituting each unit are arranged on a heat sink disposed on a common plane of a cooling device and the aforesaid cooling device is cooled by a coolant flowing in one direction. The aforesaid plurality of diodes are arranged adjacent to one another in a central area of the aforesaid heat sink, long sides of the aforesaid individual switching devices are oriented perpendicular to a flow direction of the aforesaid coolant, the aforesaid first switching device and the aforesaid second switching device are arranged on one side of the aforesaid plurality of diodes whereas the aforesaid third switching device and the aforesaid fourth switching device are arranged on the other side of the aforesaid plurality of diodes, and the aforesaid plurality of switching devices are arranged along the flow direction of the aforesaid coolant with the aforesaid plurality of diodes sandwiched in between.

In a second three-level power converting apparatus according to the present invention, each of phases constituting a power converting portion is configured by a single unit. Each unit includes four switching devices including first to fourth switching devices which are connected in series in this order between a positive terminal and a negative terminal of DC side, a first diode connected between a joint between the aforesaid first switching device and the aforesaid second switching device and a DC side middle terminal, a second diode connected between a joint between the aforesaid third switching device and the aforesaid fourth switching device and the aforesaid middle terminal, and an AC terminal between the aforesaid second switching device and the aforesaid third switching device. The aforesaid plurality of switching devices and the aforesaid plurality of diodes constituting each unit are arranged on a heat sink disposed on a common plane of a cooling device and the aforesaid cooling device is cooled by a coolant flowing in one direction. Long sides of the aforesaid individual switching devices are oriented perpendicular to a flow direction of the aforesaid coolant, the aforesaid first switching device and the aforesaid fourth switching device are arranged in a central area of the aforesaid heat sink, the aforesaid second switching device and the aforesaid first diode are arranged on one side of the aforesaid central area whereas the aforesaid third switching device and the aforesaid second diode are arranged on the other side of the aforesaid central area, and the aforesaid plurality of switching devices and the aforesaid plurality of diodes are arranged along the flow direction of the aforesaid coolant.

Advantageous Effects of the Invention

In the first and second three-level power converting apparatuses according to the present invention, semiconductor devices with high heat generation loss are not arranged adjacent to one another on upstream and downstream sides of a flow of cooling air, but are arranged in a distributed fashion. This makes it possible to average temperature increases of the individual semiconductor devices and thereby increase cooling efficiency of the cooling device.

DESCRIPTION OF THE SYMBOLS $1u$, $1v$ First switching devices
$2u$, $2v$ Second switching devices
$3u$, $3v$ Third switching devices
$4u$, $4v$ Fourth switching devices
5 IGBTs
6 Freewheeling diodes
$7u$, $7v$ Joint between first switching device and second switching device
$8u$, $8v$ Joint between third switching device and fourth switching device
$9u$, $9v$ First diodes
$10u$, $10v$ Second diodes
11, 12 Capacitors
$13u$, $13v$ Joint between first diode and second diode
$14u$, $14v$ AC terminals
15 Heat sink P Positive DC terminal
N Negative DC terminal

BEST MODES FOR CARRYING OUT THE INVENTION

First Embodiment

Figure 1:
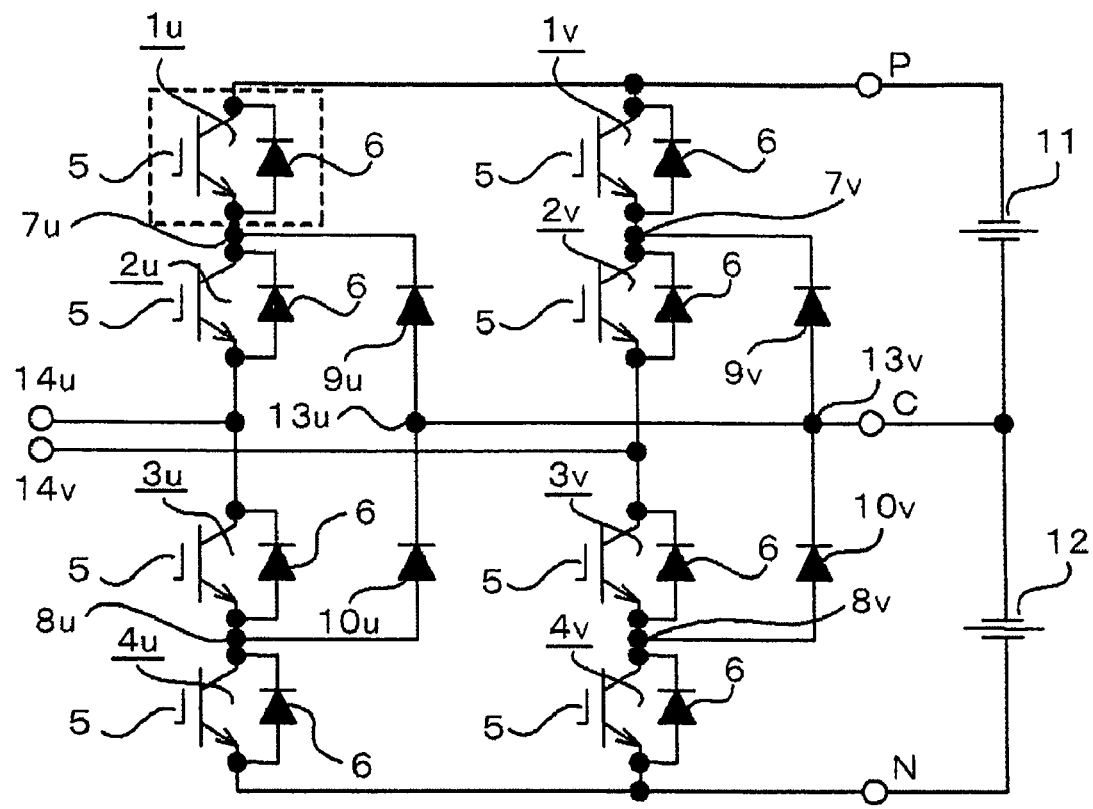
FIG. 1 is an electric circuit diagram of a power converting apparatus according to a first embodiment of the present invention.

FIG. 1 is an electric circuit diagram of a three-level power converting apparatus of the present invention applied as a converter.

Referring to FIG. 1, a U-phase unit includes a first switching device $1u$, a second switching device $2u$, a third switching device $3u$ and a fourth switching device $4u$ which are connected in series in this order between a positive DC terminal P and a negative DC terminal N.

Likewise, a V-phase unit includes a first switching device $1v$, a second switching device $2v$, a third switching device $3v$ and a fourth switching device $4v$ which are connected in series in this order between the positive DC terminal P and the negative DC terminal N.

The individual switching devices $1u$-$4u$, $1v$-$4v$ are made of self-turn-off semiconductor devices, such as insulated-gate bipolar transistors (IGBTs) or GTOs, for example. In this first embodiment, each of the switching devices $1u$-$4u$, $1v$-$4v$ configured into a single a module including an IGBT 5 and a freewheeling diode 6 which is connected to the IGBT 5 in a reverse parallel direction.

A first diode $9u$ and a second diode $10u$ are connected in series between a joint $7u$ between the first switching device $1u$ and the second switching device $2u$ of the U-phase unit and a joint $8u$ between the third switching device $3u$ and the fourth switching device $4u$ of the U-phase unit.

Similarly, a first diode $9v$ and a second diode $10v$ are connected in series between a joint $7v$ between the first switching device $1v$ and the second switching device $2v$ of the V-phase unit and a joint $8v$ between the third switching device $3v$ and the fourth switching device $4v$ of the V-phase unit.

These U-phase unit and V-phase unit are connected parallel to each other and parallel to capacitors 11 and 12 which are connected in series.

Then, a joint C between the capacitor 11 and the capacitor 12 is connected to a joint $13u$ between the first diode $9u$ and the second diode $10u$ of the U-phase unit and to a joint $13v$ between the first diode $9v$ and the second diode $10v$ of the V-phase unit.

Further, there are provided an AC terminal $14u$ between the second switching device $2u$ and the third switching device $3u$ of the U-phase unit and, similarly, an AC terminal $14v$ between the second switching device $2v$ and the third switching device $3v$ of the V-phase unit.

Figure 2:
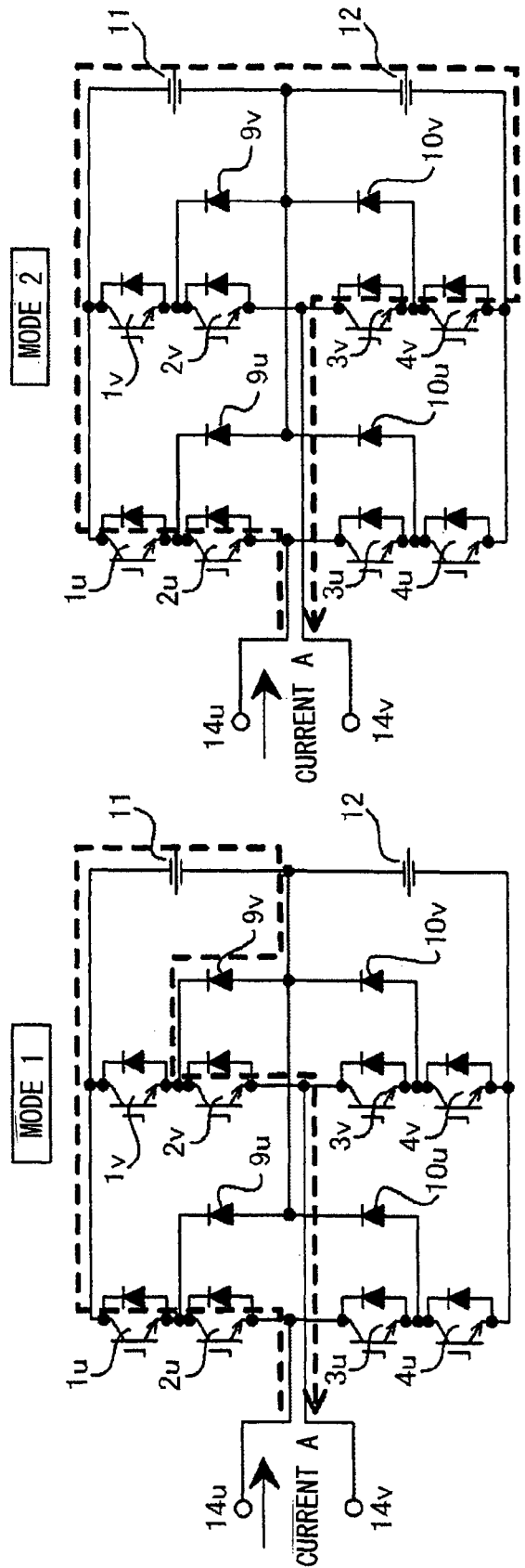
FIG. 2 is an explanatory diagram showing paths of electric currents which flow when the power converting apparatus according to the first embodiment of the present invention is operated as a converter.
Figure 3:
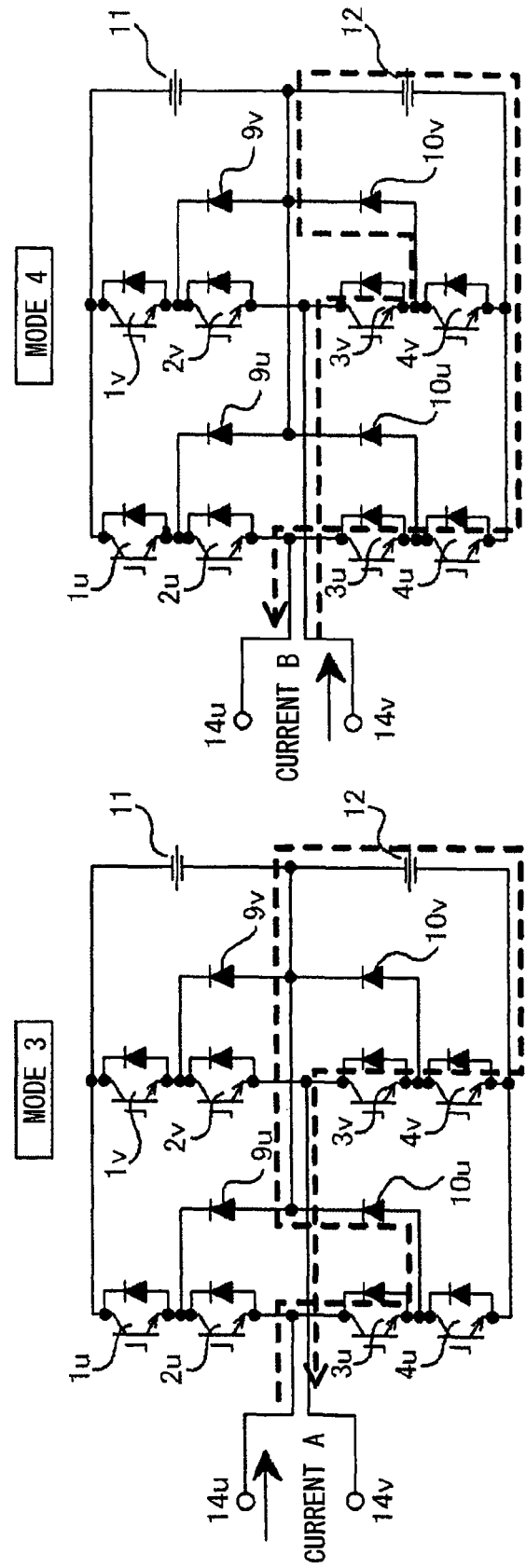
FIG. 3 is an explanatory diagram showing paths of electric currents which flow when the power converting apparatus according to the first embodiment of the present invention is operated as a converter.
Figure 4:
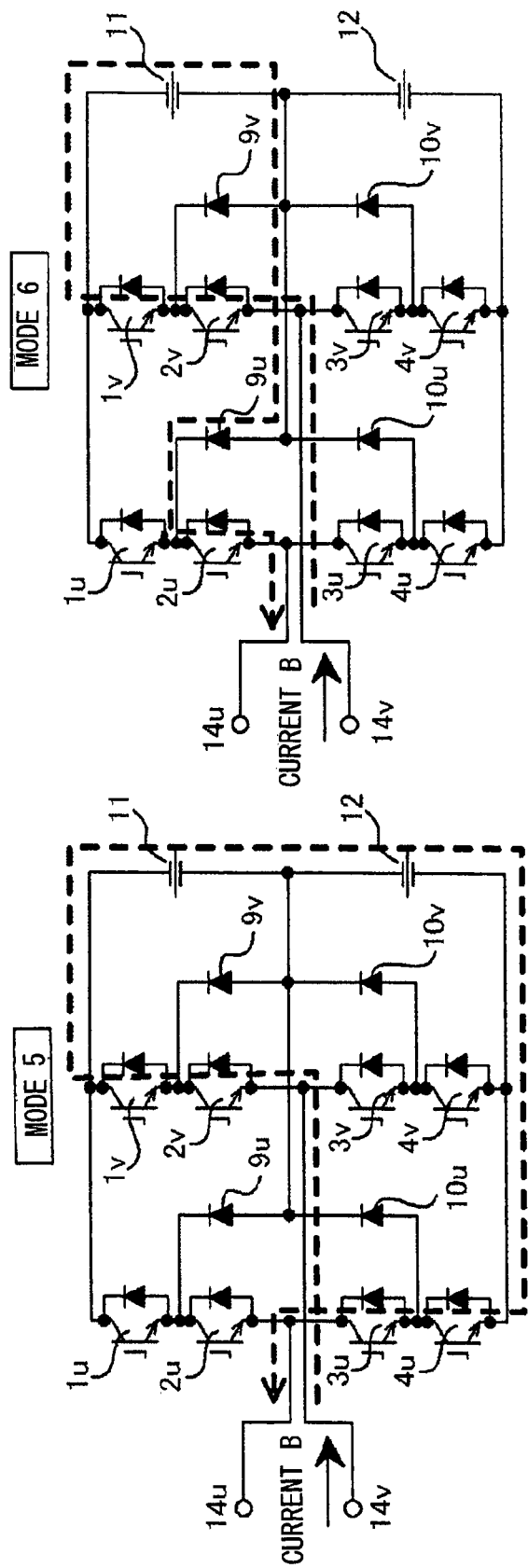
FIG. 4 is an explanatory diagram showing paths of electric currents which flow when the power converting apparatus according to the first embodiment of the present invention is operated as a converter.

Next, operation of this power converting apparatus is described. FIGS. 2 to 4 are explanatory diagrams showing paths of electric currents which flow when the three-level power converting apparatus of FIG. 1 is operated as a converter. When the three-level power converting apparatus is operated as a converter for converting AC power into DC power, conducting devices and current paths are sequentially switched from mode 1 to mode 2 through mode 6 as shown in FIGS. 2 to 4.

As the second switching device $2v$ and the fourth switching device $4v$ of the V-phase unit turn off and on, respectively, in a state of mode 1 shown in FIG. 2 in which an input current flows into the power converting apparatus in a current "A" direction from the AC terminal $14u$, the apparatus shifts to a state of mode 2. Subsequently, as the first switching device $1u$ and the third switching device 3u of the U-phase unit turn off and on, respectively, the apparatus shifts to a state of mode 3 shown in FIG. 3.

On the other hand, as the third switching device 3v and the first switching device 1v of the V-phase unit turn off and on, respectively, in a state of mode 4 shown in FIG. 3 in which the input current flows into the power converting apparatus in a current "B" direction from the AC terminal 14v, the apparatus shifts to a state of mode 5 shown in FIG. 4. Subsequently, as the fourth switching device 4u and the second switching device 2u of the U-phase unit turn off and on, respectively, the apparatus shifts to a state of mode 6.

When operated as a converter as mentioned above, the three-level power converting apparatus works in modes 1, 2, 3, 4, 5 and 6 in a repeated sequence. As a result, heat generation loss is maximized in the second switching devices 2u, 2v and the third switching devices 3u, 3v which conduct U- and V-phase currents most frequently.

Assuming that a total heat generation loss occurring in the individual switching devices and diodes of one phase is 100, heat generation losses occurring in the second switching devices and the third switching device of each phase account for 64% of the total heat generation loss as shown in Table 1 below, for example:

TABLE 1

| Ratio of heat generation losses occurring in individual semiconductor devices (relative to total loss of 100) | | | | | |
|---|---|---|---|---|---|
| First Switching Device | Second Switching Device | Third Switching Device | Fourth Switching Device | First Diode | Second Diode |
| 13% | 32% | 32% | 13% | 5% | 5% |

Figure 5:
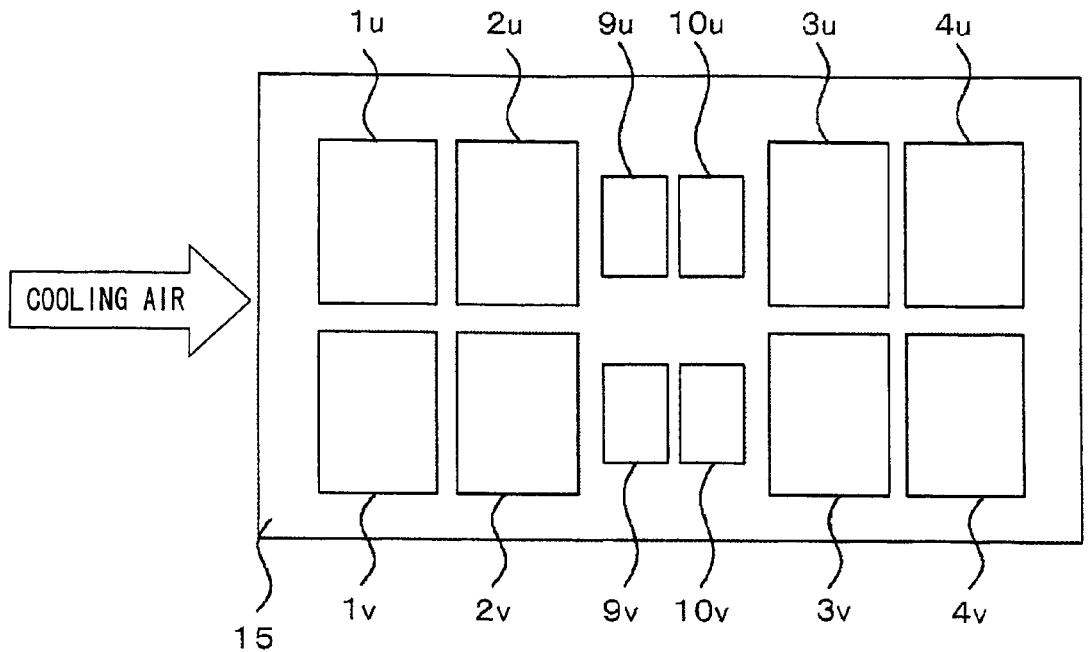
FIG. 5 is a plan view showing an arrangement of individual semiconductor devices of the power converting apparatus according to the first embodiment of the present invention.

FIG. 5 is a plan view showing an arrangement of the individual semiconductor devices and a flow direction of cooling air on a cooling device of the three-level power converting apparatus according to the first embodiment. Groups of semiconductor devices constituting individually the U-phase unit and the V-phase unit are arranged along the flow direction of the cooling air on a heat sink 15 on a common plane of the cooling device, wherein the semiconductor devices are disposed on the same plane.

As illustrated in FIG. 5, long sides of the individual switching devices and diodes are oriented in a direction perpendicular to the flow direction of the cooling air with the first diodes 9u, 9v and the second diodes 10u, 10v with minimum heat generation losses arranged adjacent to one another in a central area of the heat sink 15. The first switching devices 1u, 1v and the second switching devices 2u, 2v are arranged along the flow direction of the cooling air on one side of the first diodes 9u, 9v and the second diodes 10u, 10v whereas the third switching devices 3u, 3v and the fourth switching devices 4u, 4v are arranged equally along the flow direction of the cooling air on the other side of the first diodes 9u, 9v and the second diodes 10u, 10v.

The cooling air depicted herein is forced cooling air produced by an electric blower (not shown).

Figure 6:
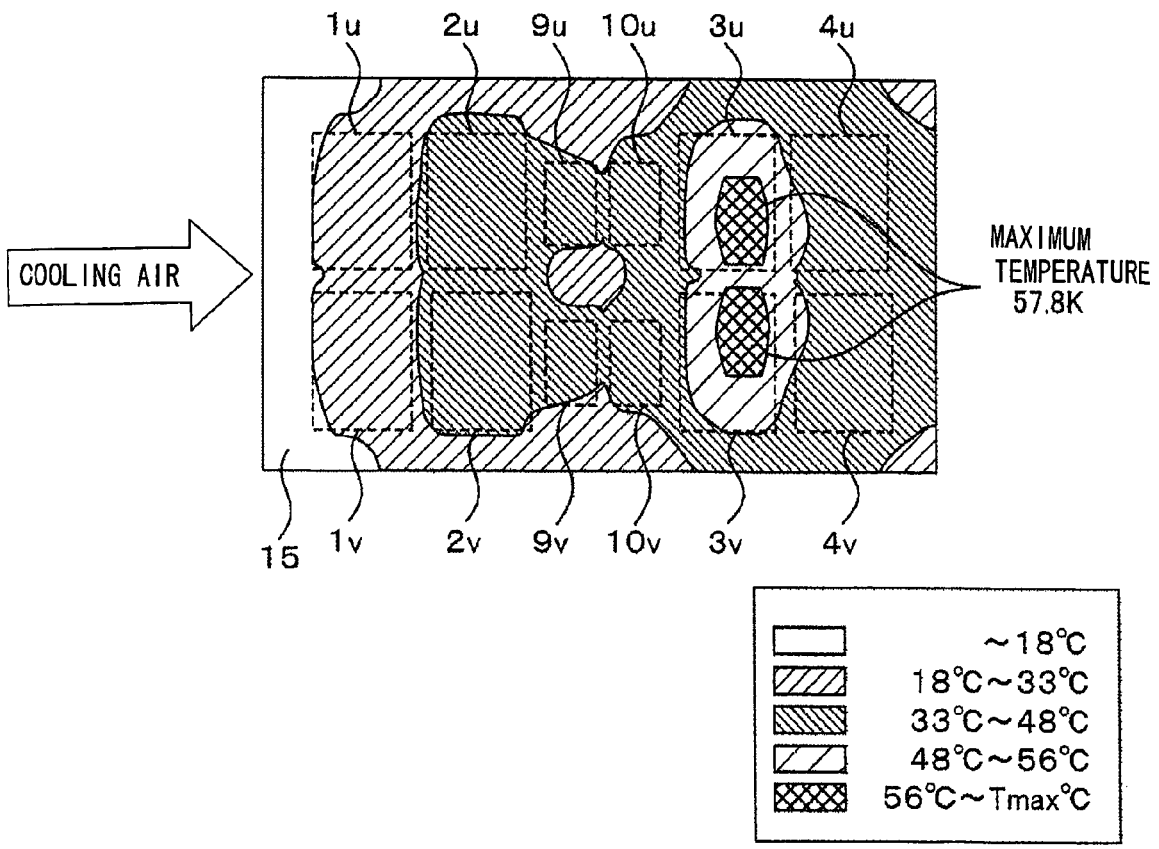
FIG. 6 is an explanatory diagram showing a result of simulation of temperature increases on a cooling device of the power converting apparatus according to the first embodiment of the present invention.
Figure 7:
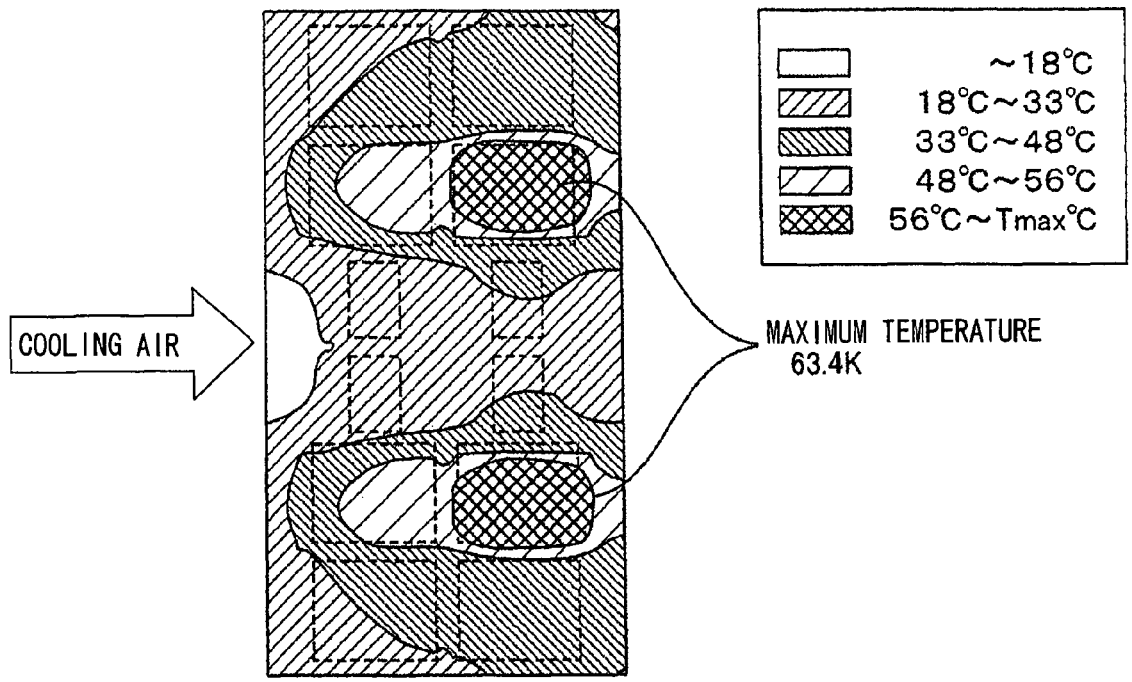
FIG. 7 is an explanatory diagram showing a result of simulation of temperature increases on a cooling device shown in FIG. 1 of Document 1.

FIG. 6 is an explanatory diagram showing a state of temperature distribution obtained as a result of analysis of temperature increases of the cooling device with an arrangement of FIG. 5 performed by using general-purpose heat flow analyzing software. FIG. 7 is an explanatory diagram showing a state of temperature distribution obtained in the same way as a result of analysis of temperature increases with the arrangement of the prior art example (Patent Document 1, FIG. 1).

To equalize conditions, a radiator portion provided on a rear side of the heat sink 15 of the cooling device employs aluminum fins and a forced cooling air method in which the cooling air is delivered by an electric blower. The aluminum fins of the individual arrangements have the equal fin height, fin length and fin pitch and produce the equal cooling air flow rate, and the heat generation losses occurring in the switching devices are distributed at percentages shown in Table 1.

As shown in FIG. 6, the temperature increase of the cooling device reaches a maximum value (Tmax) in an area surrounding the third switching devices 3u, 3v at Tmax=57.8 K (Kelvin) in this first embodiment.

On the other hand, the temperature increase of the cooling device of the prior art example is large in areas surrounding the second semiconductor device and the third semiconductor device, reaching a maximum value of Tmax=63.4 K (Kelvin) as shown in FIG. 7.

Thus, it can be recognized from this result that the temperature increases of the cooling device of the three-level power converting apparatus according to this first embodiment are averaged, resulting in a reduction in the maximum value of temperature increase of approximately 10% compared to the prior art example.

In the three-level power converting apparatus according to the first embodiment of the present invention, each phase is made of a single unit and the semiconductor devices of each unit are arranged along the flow direction of the cooling air with the long sides of the individual semiconductor devices oriented at right angles to the flow direction of the cooling air as discussed above. The first diodes 9u, 9v and the second diodes 10u, 10v are arranged in the central area of the heat sink 15 with the second switching devices 2u, 2v and the third switching devices 3u, 3v with high heat generation loss arranged in a distributed fashion to sandwich the group of diodes in the central area in between.

Since the semiconductor devices with high heat generation loss are arranged in a distributed fashion, and not adjacent to one another upstream and downstream of the cooling air flow as discussed above, the influence of exhaust heat from the individual switching devices disposed on an upwind side on the switching devices with high heat generation loss disposed on a downwind side is decreased. This makes it possible to average temperature increases of the individual switching devices and thereby increase cooling efficiency of the cooling device.

Figure 8:
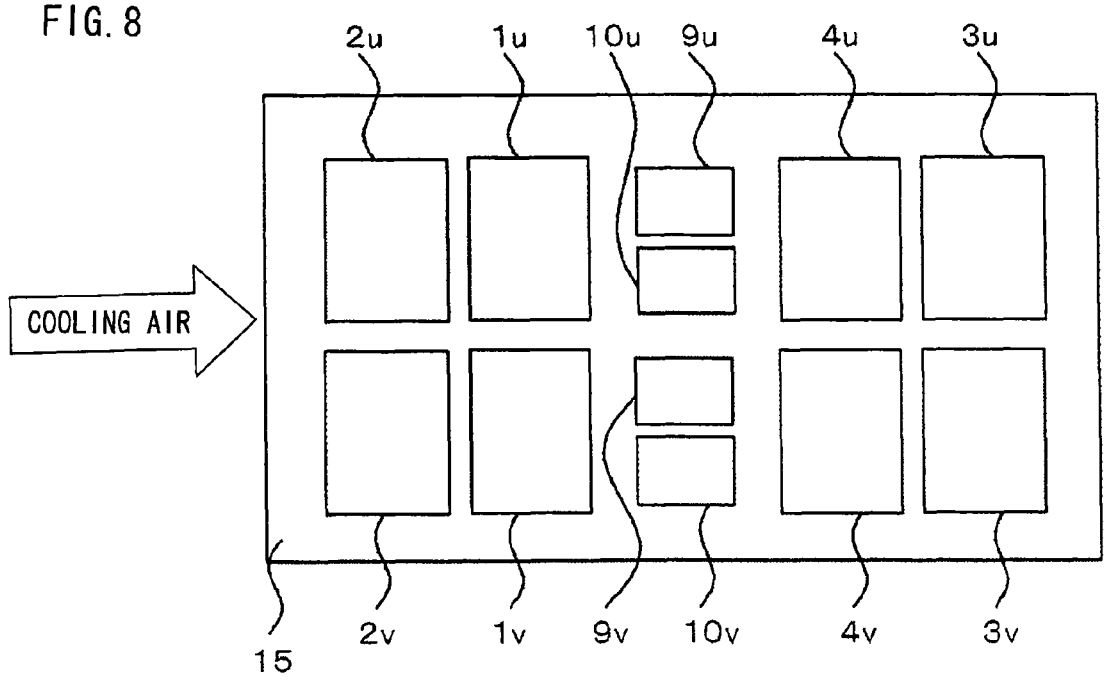
FIG. 8 is a plan view showing an arrangement of semiconductor devices on a cooling device of a power converting apparatus according to another form of the first embodiment of the present invention.

Also, while the individual switching devices and diodes are arranged as illustrated in FIG. 5 in the foregoing first embodiment, it is possible to arrange the switching devices and diodes as shown in FIG. 8. In this modified arrangement, the first diodes 9u, 9v and the second diodes 10u, 10v are arranged in the central area along the direction perpendicular to the flow direction of the cooling air with short sides of the first diodes 9u, 9v and the second diodes 10u, 10v facing the direction perpendicular to the flow direction of the cooling air.

Also, an arrangement in which locations of the first switching devices 1u, 1v and the second switching devices 2u, 2v are replaced, an arrangement in which locations of the third switching devices 3u, 3v and the fourth switching devices 4u, 4v are replaced, or a combination of these arrangements may be used, yet achieving the same advantageous effects as discussed above.

Second Embodiment

Figure 9:
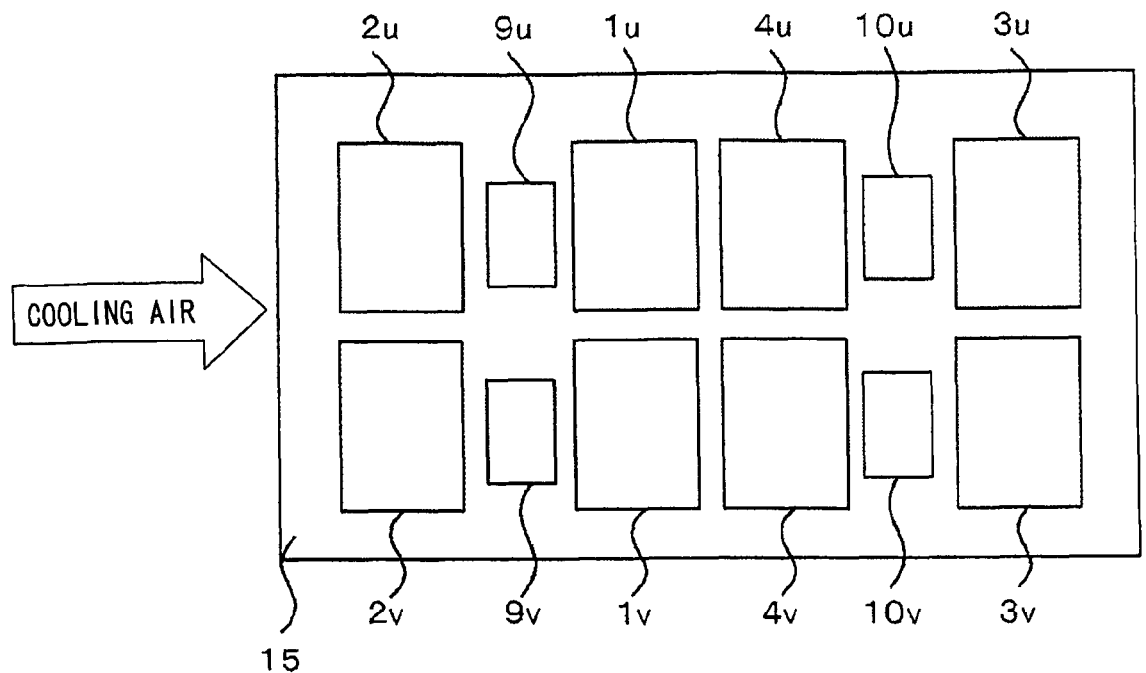
FIG. 9 is a plan view showing an arrangement of individual semiconductor devices of a power converting apparatus according to a second embodiment of the present invention.

FIG. 9 is a plan view showing an arrangement of individual semiconductor devices and a flow direction of cooling air on a cooling device of a three-level power converting apparatus according to a second embodiment of the present invention. Like the foregoing first embodiment, the second embodiment shows a configuration of the three-level power converting apparatus which is used as a converter having U- and V-phase conversion circuits. Electric circuits and operation of the second embodiment are the same as those of the first embodiment.

As shown in FIG. 9, groups of semiconductor devices constituting individually the U-phase unit and the V-phase unit are arranged along the flow direction of the cooling air with long sides of the semiconductor devices oriented in a direction perpendicular to the flow direction of the cooling air. The first switching devices $1u$, $1v$ and the fourth switching devices $4u$, $4v$ are arranged adjacent to one another in the central area of the heat sink 15. The second switching devices $2u$, $2v$ and the first diodes $9u$, $9v$ are arranged along the flow direction of the cooling air on one side of the first switching devices $1u$, $1v$ and the fourth switching devices $4u$, $4v$ whereas the third switching devices $3u$, $3v$ and the second diodes $10u$, $10v$ are arranged equally along the flow direction of the cooling air on the other side of the aforementioned first switching devices $1u$, $1v$ and fourth switching devices $4u$, $4v$.

The cooling air depicted herein is forced cooling air produced by an electric blower (not shown).

In the three-level power converting apparatus according to the second embodiment of the present invention, each phase is made of a single unit and the semiconductor devices of each unit are arranged along the flow direction of the cooling air with the long sides of the individual semiconductor devices oriented at right angles to the flow direction of the cooling air as discussed above. The first switching devices $1u$, $1v$ and the fourth switching devices $4u$, $4v$ are arranged in the central area of the heat sink 15 with the second switching devices $2u$, $2v$ and the third switching devices $3u$, $3v$ with high heat generation loss arranged in a distributed fashion to sandwich the group of switching devices in the central area in between.

Since the semiconductor devices with high heat generation loss are arranged in a distributed fashion, and not adjacent to one another upstream and downstream of the cooling air flow, the influence of exhaust heat from the individual semiconductor devices disposed on an upwind side on the semiconductor devices with high heat generation loss disposed on a downwind side is decreased. This makes it possible to average temperature increases of the individual semiconductor devices and thereby increase cooling efficiency of the cooling device.

Also, while the individual switching devices and diodes are arranged as depicted in FIG. 9 in the foregoing second embodiment, an arrangement in which locations of the first diodes $9u$, $9v$ and the second switching devices $2u$, $2v$ are replaced, an arrangement in which locations of the second diodes $10u$, $10v$ and the third switching devices $3u$, $3v$ are replaced, or a combination of these arrangements may be used, yet achieving the same advantageous effects as discussed above.

Furthermore, since the semiconductor devices of the individual units are arranged along the flow direction of the cooling air in the foregoing first and second embodiments, the semiconductor devices have small cross-sectional areas as viewed from surfaces hit by the cooling air and this serves to decrease the air flow rate required for the cooling device to produce. Therefore, it is possible, especially in the case of forced cooling, to decrease the capacity of the electric blower for achieving specific cooling performance.

While the cooling air is forced cooling air in the foregoing first and second embodiments, the same advantageous effects are obtained with wind hitting a running vehicle.

Also, a coolant used by the cooling device is the cooling air which is gas in the foregoing first and second embodiments, it is possible to employ a liquid-cooling method in which a liquid, such as cooling water, is used as a coolant which is flowed through a fluid channel provided in close proximity to the individual semiconductor devices. The same advantageous effects are expected to be achieved with this arrangement too.

INDUSTRIAL APPLICABILITY

As it is possible to make the cooling device more compact by increasing the cooling efficiency of the cooling device, the invention may be used in applications requiring reductions in size and weight.

The invention claimed is:

1. A three-level power converting apparatus for multiple phases configured with a plurality of units for the individual phases, respectively, each unit comprising:

four switching devices including first to fourth switching devices which are connected in series in an order of said first switching device, said second switching device, said third switching device and said fourth switching device between a positive terminal and a negative terminal of a DC side, said second and third switching devices each respectively having, during operation of the converting apparatus, a higher heat generation loss than each one of said first and fourth switching devices;

a first diode connected between a joint between said first switching device and said second switching device and a DC side middle terminal;

a second diode connected between a joint between said third switching device and said fourth switching device and said middle terminal; and an AC terminal between said second switching device and said third switching device;

wherein said plurality of switching devices and said plurality of diodes of said units are arranged on a heat sink disposed on a common plane of a cooling device, and said cooling device is cooled by a coolant flowing in one direction, and wherein each of said units is configured such that said plurality of diodes are arranged adjacent to one another in a central area of said heat sink, said first switching device and said second switching device are arranged on one side of said plurality of diodes, said third switching device and said fourth switching device are arranged on the other side of said plurality of diodes opposite to said one side of said plurality of diodes, and said plurality of switching devices are linearly arrayed parallel to a flow direction of said coolant, with long sides of said switching devices oriented perpendicular to the flow direction of said coolant, and with said plurality of diodes sandwiched in between, so that said second and third switching devices having the higher generation loss among said plurality of switching devices are separated from each other in the flow direction by said plurality of diodes interposed in between said second and third switching devices.

2. A three-level power converting apparatus for multiple phases configured with a plurality of units for the individual phases, respectively, each unit comprising:

four switching devices including first to fourth switching devices which are connected in series in an order of said first switching device, said second switching device, said third switching device and said fourth switching device between a positive terminal and a negative terminal of a DC side, said second and third switching devices each respectively having, during operation of the converting apparatus, a higher heat generation loss than each one of said first and fourth switching devices;

a first diode connected between a joint between said first switching device and said second switching device and a DC side middle terminal;

a second diode connected between a joint between said third switching device and said-fourth switching device and said middle terminal; and an AC terminal between said second switching device and said third switching device;

wherein said plurality of switching devices and said plurality of diodes of said units are arranged on a heat sink disposed on a common plane of a cooling device, and said cooling device is cooled by a coolant flowing in one direction, and wherein each of said units is configured such that said first switching device and said fourth switching device are arranged in a central area of said heat sink, said second switching device and said first diode are arranged on one side of said central area, whereas said third switching device and said second diode are arranged on the other side of said central area, opposite to said one side of said central area, and said plurality of switching devices and said plurality of diodes are linearly arrayed parallel to a flow direction of said coolant with long sides of said individual switching devices oriented perpendicular to the flow direction, so that said second and third switching devices having the higher generation loss among said plurality of switching devices are separated from each other in the flow direction by said first and fourth switching devices interposed in between said second and third switching devices.

3. The three-level power converting apparatus of claim 1, wherein the arrangement of the plurality of switching devices and diodes on said heat sink provides an averaged temperature increase of the switching devices, thereby increasing cooling efficiency.

4. The three-level power converting apparatus of claim 1, wherein the arrangement of the plurality of switching devices and diodes on said heat sink minimizes the influence of exhaust heat from said switching devices disposed on an upwind side of a cooling device on the switching devices disposed on the downwind side of the cooling device.

5. The three-level power converting apparatus of claim 2, wherein the arrangement of the plurality of switching devices and diodes on said heat sink provides an averaged temperature increase of the switching devices, thereby increasing cooling efficiency.

6. The three-level power converting apparatus of claim 2, wherein the arrangement of the plurality of switching devices and diodes on said heat sink minimizes the influence of exhaust heat from said switching devices disposed on an upwind side of a cooling device on the switching devices disposed on the downwind side of the cooling device.

* * * * *